US010468089B1

(12) United States Patent
Chen et al.

(10) Patent No.: US 10,468,089 B1
(45) Date of Patent: Nov. 5, 2019

(54) VOLTAGE-STABILIZING CIRCUIT, DRAM, AND METHOD FOR STABILIZING A BIT LINE VOLTAGE

(71) Applicant: NANYA TECHNOLOGY CORPORATION, New Taipei (TW)

(72) Inventors: Chih-Jen Chen, Taoyuan (TW); Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/997,427

(22) Filed: Jun. 4, 2018

(51) Int. Cl.
| G11C 5/14 | (2006.01) |
| G11C 11/4074 | (2006.01) |
| G11C 16/30 | (2006.01) |
| G11C 8/08 | (2006.01) |

(52) U.S. Cl.
CPC .......... *G11C 11/4074* (2013.01); *G11C 5/145* (2013.01); *G11C 5/147* (2013.01); *G11C 8/08* (2013.01); *G11C 16/30* (2013.01)

(58) Field of Classification Search
CPC ..... G11C 11/4074; G11C 5/147; G11C 5/145; G11C 8/08; G11C 16/30
See application file for complete search history.

(56) References Cited

U.S. PATENT DOCUMENTS

| 5,896,320 A * | 4/1999 | Taguchi | G11C 5/14 |
| | | | 327/57 |
| 6,157,589 A * | 12/2000 | Krause | G11C 7/1072 |
| | | | 365/226 |
| 7,808,843 B2 * | 10/2010 | Kuzmenka | G11C 5/147 |
| | | | 327/337 |
| 8,537,626 B2 * | 9/2013 | Fujisawa | G11C 7/109 |
| | | | 365/191 |

* cited by examiner

*Primary Examiner* — Pho M Luu
(74) *Attorney, Agent, or Firm* — Muncy, Geissler, Olds & Lowe, P.C.

(57) ABSTRACT

A voltage-stabilizing circuit includes a voltage-dividing module, a first stabilizing module and a second stabilizing module. The voltage-dividing module is configured to generate a plurality of reference voltages. The voltage-dividing module includes a plurality of resistors and a transistor unit. The transistor unit is coupled to the plurality of resistors and is configured to complementarily adjust resistances of the plurality of resistors. The first stabilizing module is coupled to the voltage-dividing module and is configured to generate a first stabilizing voltage. The first stabilizing voltage is equal to a middle one of the plurality of reference voltages. The second stabilizing module is coupled to the voltage-dividing module and is configured to generate a second stabilizing voltage. The second stabilizing voltage is equal to one of the plurality of reference voltages other than the middle one.

18 Claims, 14 Drawing Sheets

VOLTAGE-STABILIZING CIRCUIT, DRAM, AND METHOD FOR STABILIZING A BIT LINE VOLTAGE

TECHNICAL FIELD

The present disclosure relates to a circuit, a dynamic random access memory (DRAM) and a method, and more particularly, to a voltage-stabilizing circuit, a DRAM, and a method for stabilizing a bit line voltage.

DISCUSSION OF THE BACKGROUND

A DRAM includes a memory array including a plurality of bit lines. When the memory array reads or writes data, current of the memory array is consumed, and decreases of a plurality of bit line voltages are thereby caused.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a voltage-stabilizing circuit. The voltage-stabilizing circuit comprises a voltage-dividing module, a first stabilizing module and a second stabilizing module. The voltage-dividing module is configured to generate a plurality of reference voltages. The first stabilizing module is coupled to the voltage-dividing module and is configured to generate a first stabilizing voltage, wherein the first stabilizing voltage is equal to a middle one of the plurality of reference voltages. The second stabilizing module is coupled to the voltage-dividing module and is configured to generate a second stabilizing voltage, wherein the second stabilizing voltage is equal to one of the plurality of reference voltages other than the middle one.

In some embodiments, the voltage-stabilizing circuit further comprises a first enabling module and a second enabling module. The first enabling module is coupled to the first stabilizing module and is configured to generate a first enable signal. The second enabling module is coupled to the second stabilizing module and is configured to generate a second enable signal.

In some embodiments, the voltage-stabilizing circuit further comprises a controlling module coupled to the first enabling module and the second enabling module, wherein the controlling module is configured to send control signals to the first enabling module and the second enabling module.

In some embodiments, the controlling module sends the control signals to the first enabling module and the second enabling module under different conditions.

In some embodiments, the voltage-dividing module is further configured to convert a memory array voltage into the plurality of reference voltages. In some embodiments, the voltage-dividing module includes a plurality of resistors and a transistor unit. The transistor unit is coupled to the plurality of resistors and is configured to complementarily adjust resistances of the plurality of resistors.

In some embodiments, the first stabilizing module includes an operational amplifier coupled to the voltage-dividing module, wherein the operational amplifier is configured to generate the first stabilizing voltage.

In some embodiments, the second stabilizing module includes two operational amplifiers, both coupled to the voltage-dividing module. In some embodiments, one of the two operational amplifiers is configured to generate the second stabilizing voltage.

Another aspect of the present disclosure provides a dynamic random access memory (DRAM). The DRAM comprises a memory array, a plurality of bit lines and a voltage-stabilizing module. The plurality of bit, lines are existed in the memory array. The voltage-stabilizing module is coupled to the plurality of bit lines. In some embodiments, the voltage stabilizing module includes a voltage-dividing module, a first stabilizing module and a second stabilizing module. The voltage-dividing module is configured to generate a plurality of reference voltages. The first stabilizing module is coupled to the voltage-dividing module and is configured to generate a first stabilizing voltage, wherein the first stabilizing voltage is equal to a middle one of the plurality of reference voltages. The second stabilizing module is coupled to the voltage-dividing module and is configured to generate a second stabilizing voltage, wherein the second stabilizing voltage is equal to one of the plurality of reference voltages other than the middle one.

In some embodiments, the DRAM further comprises a first enabling module and a second enabling module. The first enabling module is coupled to the first stabilizing module and is configured to generate a first enable signal. The second enabling module is coupled to the second stabilizing module and is configured to generate a second enable signal.

In some embodiments, the DRAM further comprises a controlling module coupled to the first enabling module and the second enabling module, wherein the controlling module is configured to send control signals to the first enabling module and the second enabling module.

In some embodiments, the controlling module sends the control signals to the first enabling module and the second enabling module under different conditions.

In some embodiments, the voltage-dividing module is further configured to convert a memory array voltage into the plurality of reference voltages. In some embodiments, the voltage-dividing module includes a plurality of resistors and a transistor unit. The transistor unit is coupled to the plurality of resistors and is configured to complementarily adjust resistances of the plurality of resistors.

In some embodiments, the first stabilizing module includes an operational amplifier coupled to the voltage-dividing module, wherein the operational amplifier is configured to generate the first stabilizing voltage.

In some embodiments, the second stabilizing module includes two operational amplifiers, both coupled to the voltage-dividing module. In some embodiments, one of the two operational amplifiers is configured to generate the second stabilizing voltage.

Another aspect of the present disclosure provides a method for stabilizing a bit line voltage. The method comprises the following steps. A plurality of reference voltages are generated. A first stabilizing voltage, which is equal to a middle one of the plurality of reference voltages, is generated. The first stabilizing voltage is coupled with a bit line voltage in a first operation state and a second operation state.

In some embodiments, the plurality of reference voltages are generated by dividing a memory array voltage.

In some embodiments, the method further comprises a step, in which a first stabilizing module is enabled to generate the first stabilizing voltage.

In some embodiments, the method further comprises the following steps. A second stabilizing voltage, which is equal to one of the plurality of reference voltages other than the middle one, is generated. The second stabilizing voltage is coupled with the bit line voltage in the second operation state.

In some embodiments, the method further comprises a step, in which a second stabilizing module is enabled to generate the second stabilizing voltage.

In some embodiments, the method further comprises a step, in which control signals are generated for a first enabling module and a second enabling module under different conditions.

With the above-mentioned configurations of the voltage-stabilizing circuit, a working current required to stabilize a bit line voltage is decreased. In addition, an accuracy and an efficiency of a voltage-stabilizing process are increased.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
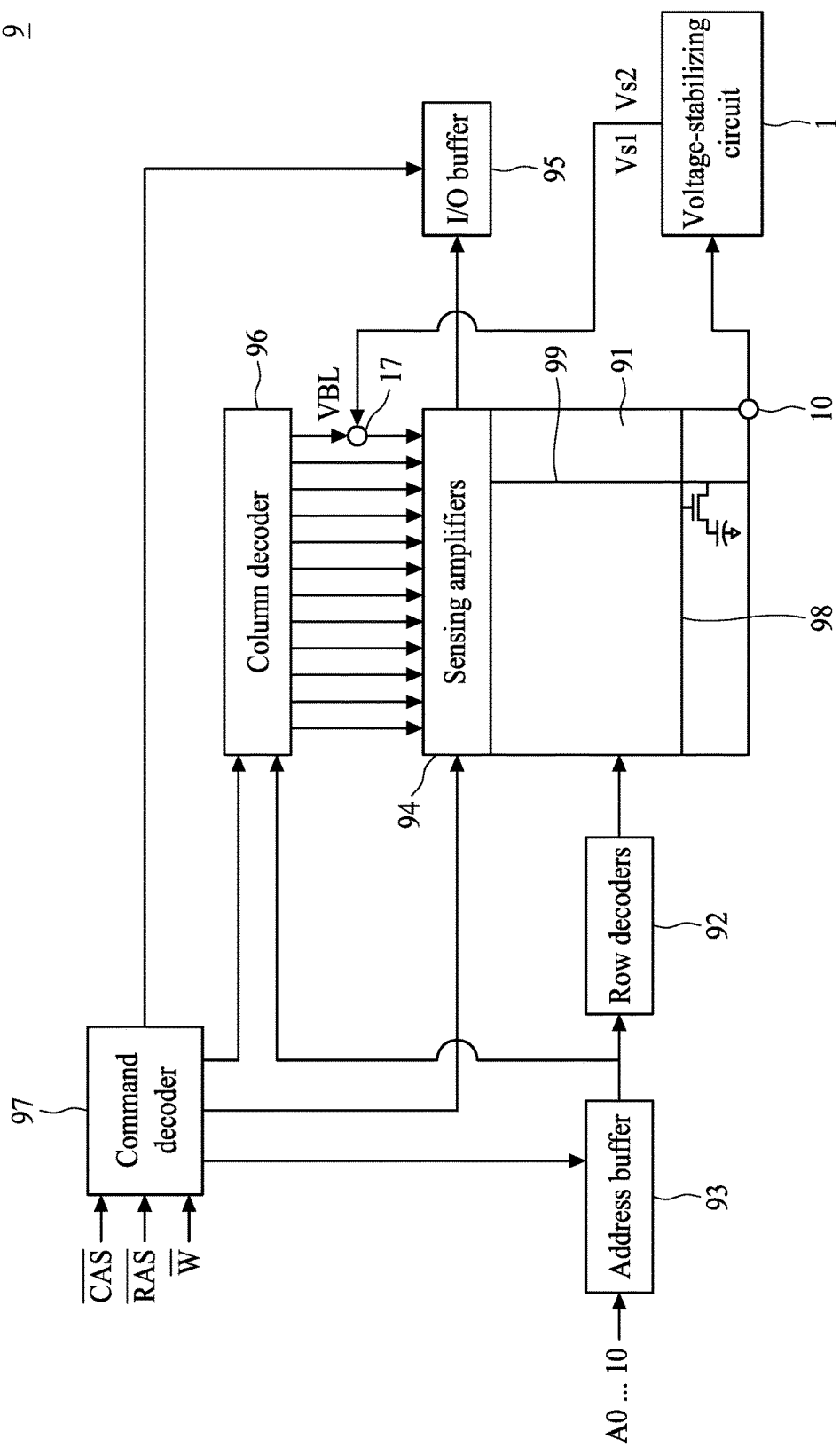
FIG. 1 is a block diagram of a DRAM in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of a DRAM 9 in accordance with some embodiments of the present disclosure. Referring to FIG. 1, in some embodiments, the DRAM 9 includes a memory array 91, a plurality of row decoders 92, an address buffer 93, a plurality of sensing amplifiers 94, an I/O buffer 95, a plurality of column decoders 96, a command decoder 97, a plurality of word lines 98 and a plurality of bit lines 99. In some embodiments, the plurality of row decoders 92 are coupled to the memory array 91. In some embodiments, the address buffer 93 is coupled to the plurality of row decoders 92. In some embodiments, the plurality of sensing amplifiers 94 are coupled to the memory array 91. In some embodiments, the I/O buffer 95 is coupled to the plurality of sensing amplifiers 94. In some embodiments, the plurality of column decoders 96 are respectively coupled to the sensing amplifiers 94. In some embodiments, the command decoder 97 is coupled to the address buffer 93, the plurality of column decoders 96, the plurality of sensing amplifiers 94 and the I/O buffer 95. In some embodiments, the plurality of word lines 98 are existed in the memory array 91. In some embodiments, the plurality of bit lines 99 are existed in the memory array 91 and intersect the plurality of word lines 98. In some embodiments, the DRAM 9 includes a voltage-stabilizing circuit 1 coupled to the plurality of bit lines 99.

Figure 2:
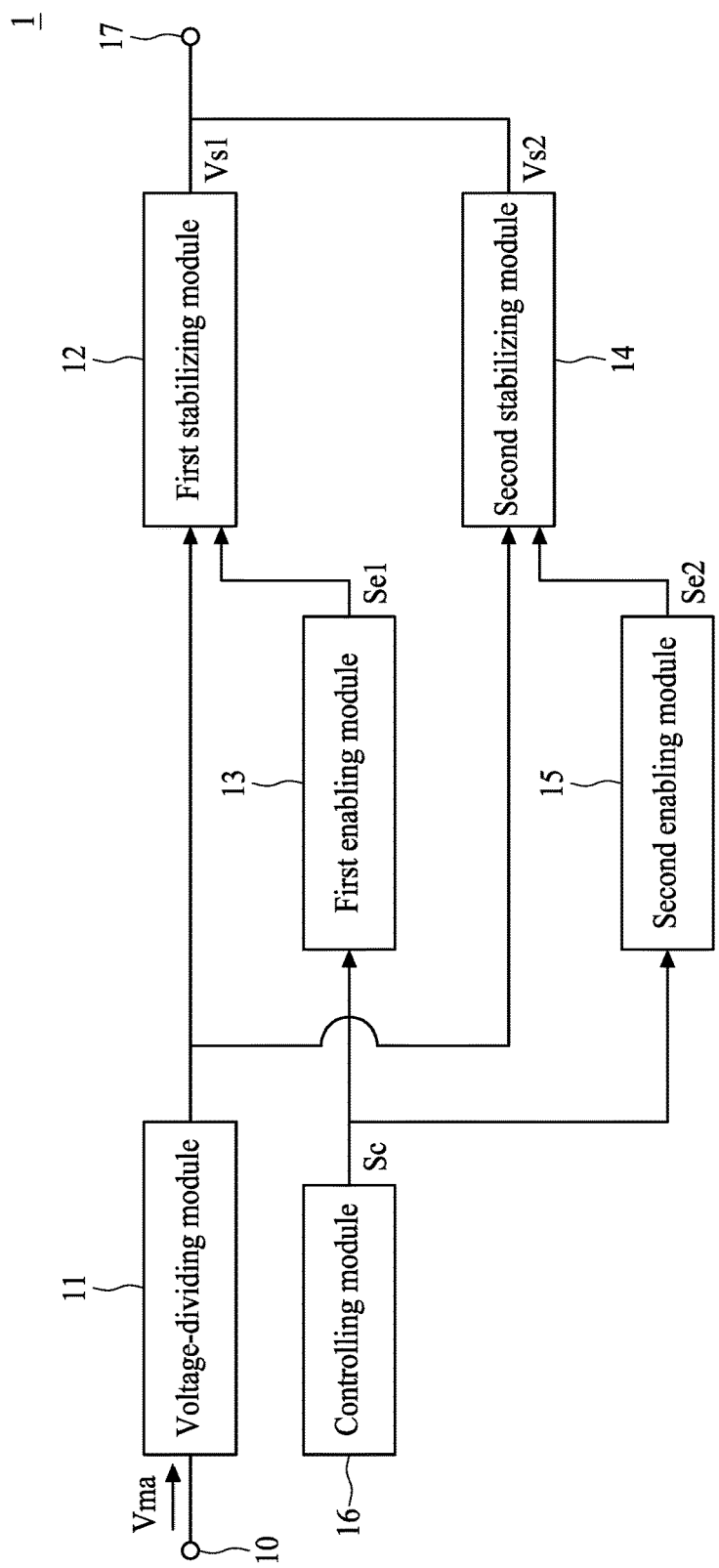
FIG. 2 is a block diagram of a voltage-stabilizing circuit of the DRAM in accordance with some embodiments of the present disclosure.

FIG. 2 is a block diagram of the voltage-stabilizing circuit 1 of the DRAM 9 in accordance with some embodiments of the present disclosure. Referring to FIG. 2, in some embodiments, the voltage-stabilizing circuit 1 includes a voltage input 10, a voltage-dividing module 11, a first stabilizing module 12, a first enabling module 13, a second stabilizing module 14, a second enabling module 15, a controlling module 16 and a bit line voltage precharge (VBLP) output 17.

Referring to FIG. 2, in some embodiments, the first stabilizing module 12 is coupled to the VBLP output 17 and is configured to generate a first stabilizing voltage (Vs1). In some embodiments, the second stabilizing module 14 is coupled to the VBLP output 17 and is configured to generate a second stabilizing voltage (Vs2). In some embodiments, the first enabling module 13 is coupled to the first stabilizing module 12 and is configured to generate a first enable signal (Se1). In some embodiments, the second enabling module 15 is coupled to the second stabilizing module 14 and is configured to generate a second enable signal (Se2). In some embodiments, the voltage-dividing module 11 is coupled between the voltage input 10 and the first stabilizing module 12, and between the voltage input 10 and the second stabilizing module 14. In some embodiments, the voltage-dividing module 11 is configured to divide a memory array voltage (Vma) into a plurality of reference voltages. In some embodiments, the controlling module 16 is coupled to the first and second enabling modules 15. In some embodiments, the controlling module 16 is configured to generate control signals (Sc).

Referring to FIG. 2, in some embodiments, when the DRAM 9 is in a first operation state (e.g., standby state), the controlling module 16 sends the control signal (Sc) to the first enabling module 13 so as to control the first enabling module 13 to send the first enable signal (Se1) to enable an operation of the first stabilizing module 12, and when the DRAM 9 is in a second operation state (e.g., read/write state), the controlling module 16 sends the control signal (Sc) to the first enabling module 13 so as to control the first enabling module 13 to send the first enable signal (Se1) to enable the operation of the first stabilizing module 12, and sends another control signal (Sc) to the second enabling module 15 so as to control the second enabling module 15 to send the second enable signal (Se2) to enable an operation of the second stabilizing module 14.

Figure 3:
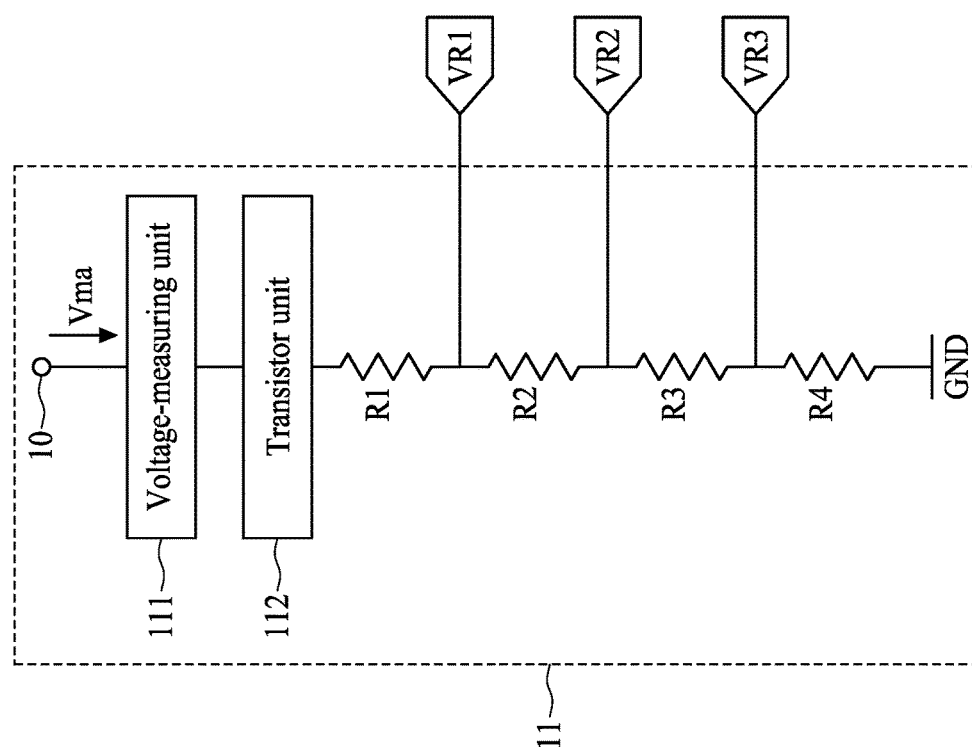
FIG. 3 is a block diagram illustrating a voltage-dividing module of the voltage-stabilizing circuit in accordance with some embodiments of the present disclosure.

FIG. 3 is a block diagram illustrating the voltage-dividing module 11 of the voltage-stabilizing circuit 1 in accordance with some embodiments of the present disclosure. Referring to FIG. 3, in some embodiments, the voltage-dividing module 11 includes a voltage-measuring unit 111, a transistor unit 112 and a plurality of resistors. In some embodiments, the voltage-measuring unit 111 is coupled to the voltage input 10 and is configured to measure the memory array voltage (Vma) through the voltage input 10. In some embodiments, the transistor unit 112 is coupled between the voltage-measuring unit 111 and the plurality of resistors, and the transistor unit 112 is configured to complementarily adjust resistances of the plurality of resistors. In some embodiments, the voltage-dividing module 11 is configured to generate a plurality of reference voltages. In some embodiments, the plurality of reference voltages are converted from the memory array voltage (Vma) through the plurality of resistors. In some embodiments, the resistances of the plurality of resistors are the same, while in other embodiments, the resistances of the plurality of resistors may be different from each other.

Referring to FIG. 3, in some embodiments, the transistor unit 112 includes a plurality of transistors. In some embodiments, the plurality of transistors are implemented by a plurality of metal-oxide-semiconductor field-effect transistors (MOSFETs). In some embodiments, each of the plurality of transistors includes a gate, a drain and a source, and when the plurality of transistors are actuated, each of the plurality of transistors has a linear resistance defined as a drain-source on resistance (RDS). In some embodiments, complementary resistances for the plurality of resistors are implemented by respective RDSs of the plurality of transistors.

Referring to FIG. 3, in some embodiments, because the RDS is controlled by a gate-to-source voltage, the RDS can be changed by adjusting the gate-to-source voltage. Consequently, the complementary resistances can be implemented by the plurality of transistors at different gate-to-source voltages.

Referring to FIG. 3, in some embodiments, the voltage-dividing module 11 includes four resistors (R1, R2, R3 and R4), while in other embodiments, the number of the resistors included in the voltage-dividing module 11 may be varied. In some embodiments, the four resistors (R1, R2, R3 and R4) divides the memory array voltage into three reference voltages (VR1, VR2 and VR3), while in other embodiments, such configuration may be varied.

Figure 4:
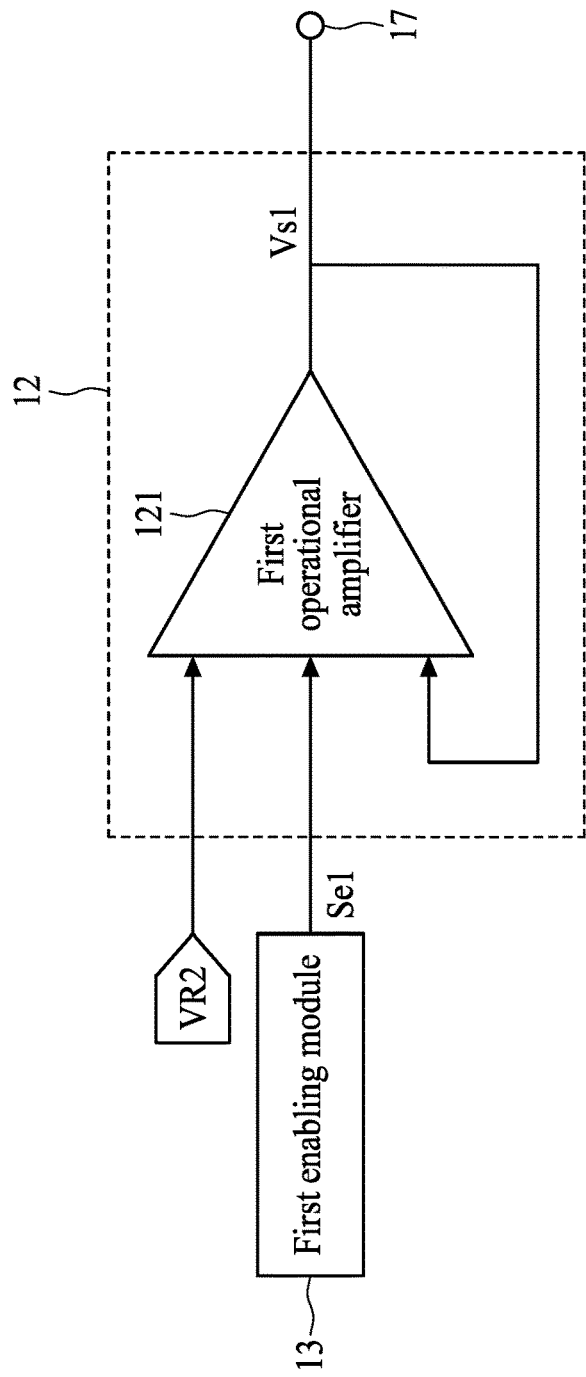
FIG. 4 is a block diagram illustrating a first stabilizing module of the voltage-stabilizing circuit in accordance with some embodiments of the present disclosure.

FIG. 4 is a block diagram illustrating the first stabilizing module 12 of the voltage-stabilizing circuit 1 in accordance with some embodiments of the present disclosure. Referring to FIG. 4, in some embodiments, the first stabilizing module 12 includes a first operational amplifier 121 coupled between the voltage dividing module 11 (see FIG. 3) and the VBLP output 17, and the first operational amplifier 121 is configured to generate the first stabilizing voltage (Vs1). In some embodiments, the first stabilizing voltage (Vs1) is equal to a middle one of the plurality of reference voltages. In some embodiments, the first stabilizing voltage (Vs1) is equal to the second reference voltage (VR2). In some embodiments, the first stabilizing voltage (Vs1) is coupled to the plurality of bit lines 99 (see FIG. 1) through the VBLP output 17. In some embodiments, the first stabilizing module 12 is implemented by a voltage follower circuit, while in other embodiments, such configuration may be varied.

Referring to FIG. 4, in some embodiments, the first enable signal (Se1) is generated for enabling an operation of the first operational amplifier 121 of the first stabilizing module 12 when the DRAM 9 is in the standby state or the read/write state.

Figure 5:
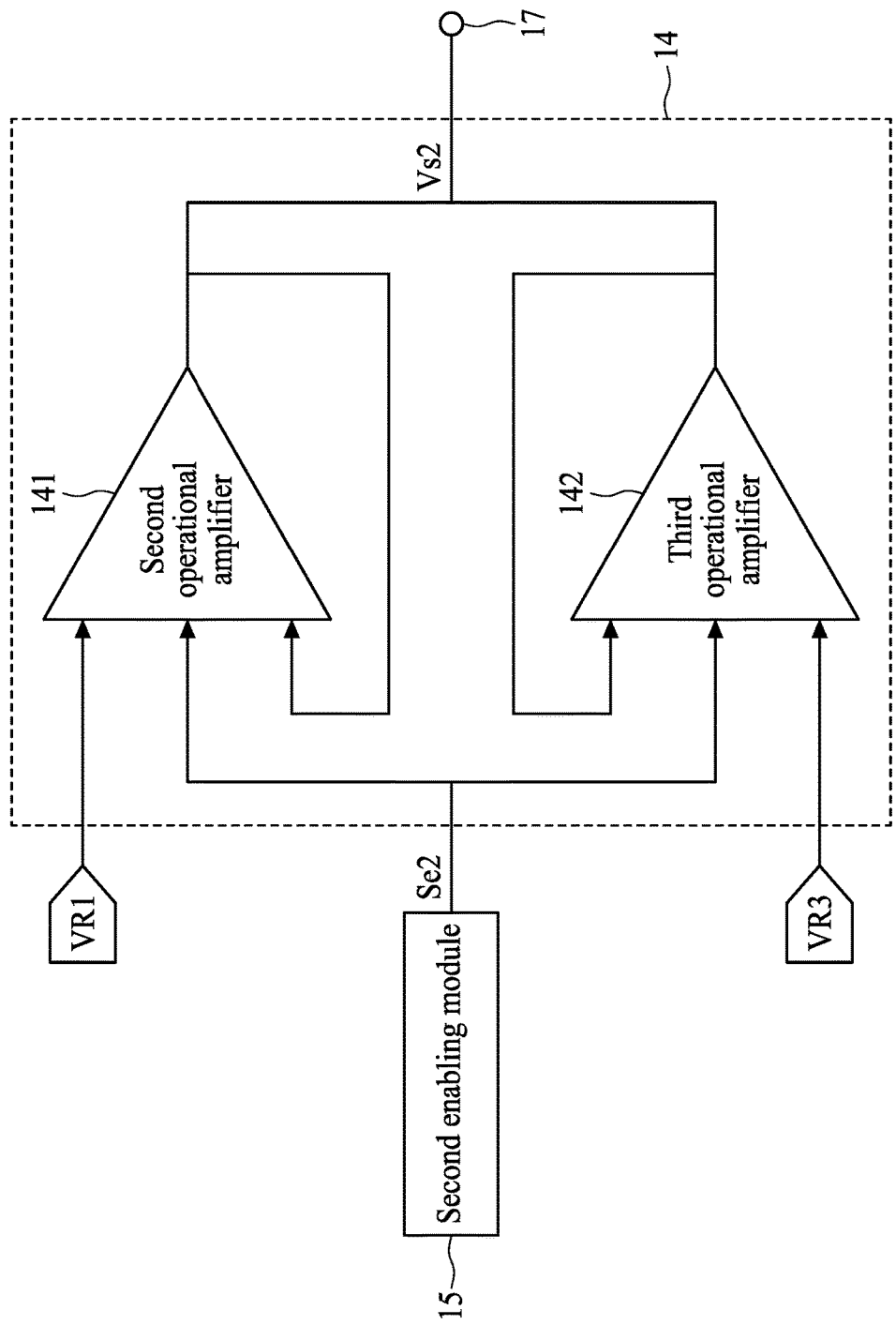
FIG. 5 is a block diagram illustrating a second stabilizing module of the voltage-stabilizing circuit in accordance with some embodiments of the present disclosure.

FIG. 5 is a block diagram illustrating the second stabilizing module 14 of the voltage-stabilizing circuit 1 in accordance with some embodiments of the present disclosure. Referring to FIG. 5, in some embodiments, the second stabilizing module 14 includes a second operational amplifier 141 and a third operational amplifier 142. In some embodiments, the second operational amplifier 141 and the third operational amplifier 142 are coupled between the voltage-dividing module 11 (see FIG. 3) and the VBLP output 17. In some embodiments, the first reference voltage (VR1) is sent to the second operational amplifier 141, and the third reference voltage (VR3) is sent to the third operational amplifier 142, while in other embodiments, such configurations may be varied. In some embodiments, the second stabilizing module 14 is implemented by two voltage follower circuits, the second operational amplifier 141 is coupled to one of the two voltage follower circuits, and the third operational amplifier 142 is coupled to the other one of the two voltage follower circuits. In other embodiments, arrangements of the two voltage follower circuits may be varied. In some embodiments, the second stabilizing voltage (Vs2) is equal to one of a highest and a lowest of the plurality of reference voltages. In some embodiments, the second stabilizing voltage (Vs2) is equal to one of the first reference voltage (VR1) and the third reference voltage (VR3). In some embodiments, the second stabilizing voltage (Vs2) is coupled to the plurality of bit lines 99 (see FIG. 1) through the VBLP output 17.

Referring to FIG. 5, in some embodiments, the second enable signal (Se2) is generated for enabling an operation of one of the second operational amplifier 141 and the third operational amplifier 142 of the 15s second stabilizing module 14 when the DRAM 9 is in the read/write state. In some embodiments, one of the second operational amplifier 141 and the third operational amplifier 142 is configured to generate the second stabilizing voltage (Vs2) based on the second enable signal (Se2).

Figure 6:
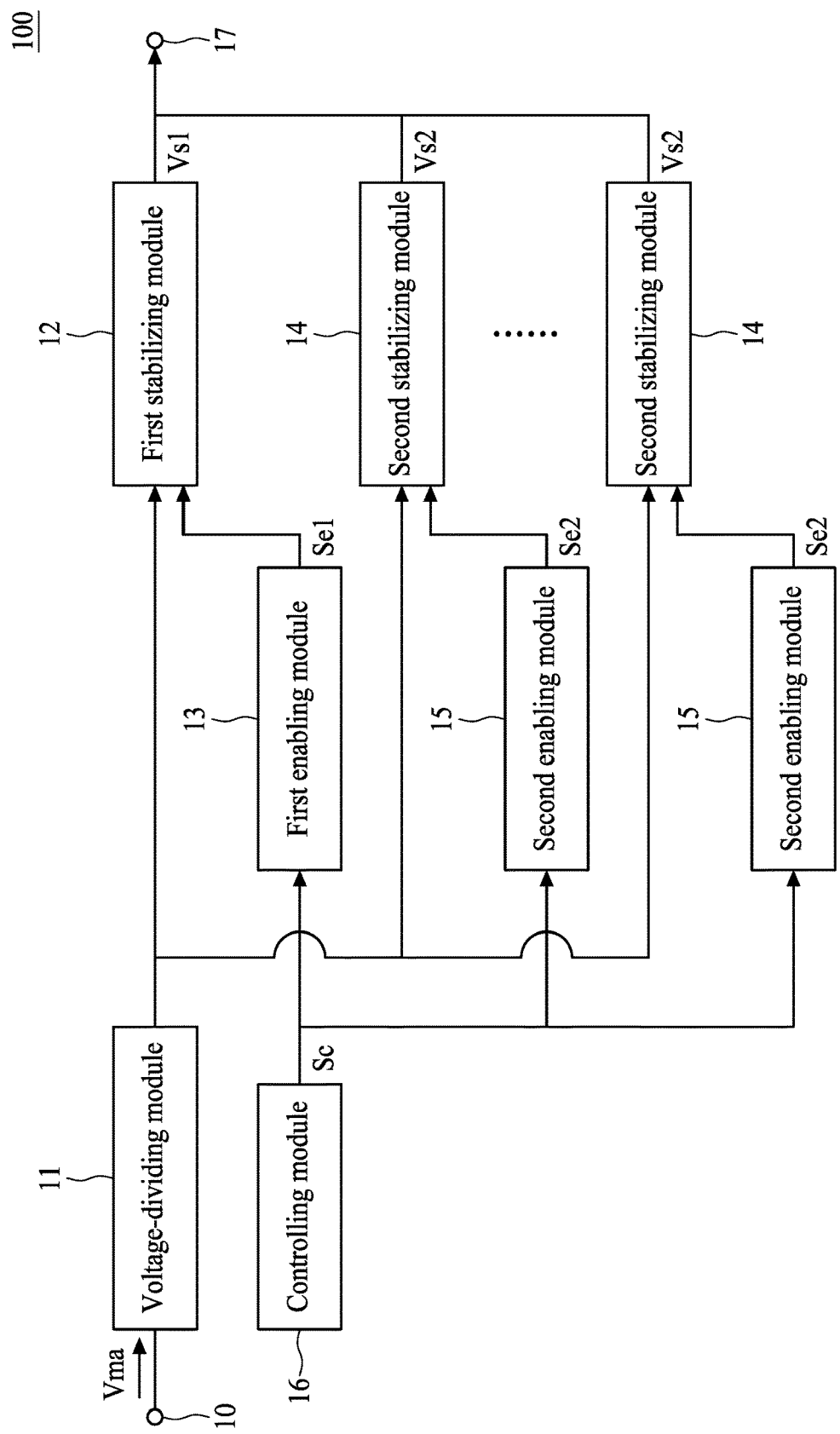
FIG. 6 is another block diagram of the voltage-stabilizing circuit of the DRAM in accordance with some embodiments of the present disclosure.

FIG. 6 is another block diagram of a voltage-stabilizing circuit 100 of the DRAM 9 in accordance with some embodiments of the present disclosure. Referring to FIG. 6, in some embodiments, the voltage-stabilizing circuit 100 is substantially similar to the voltage-stabilizing circuit 1 except for the quantity of the second stabilizing modules 14 and the second enabling modules 15. In some embodiments, the voltage-stabilizing circuit 1 in FIG. 2 includes one second stabilizing module 14 and one second enabling module 15 coupled to the second stabilizing module 14; in contrast, the voltage-stabilizing circuit 100 includes a plurality of second stabilizing modules 14, and a plurality of second enabling modules 15 respectively coupled to the plurality of second stabilizing modules 14.

Figure 7:
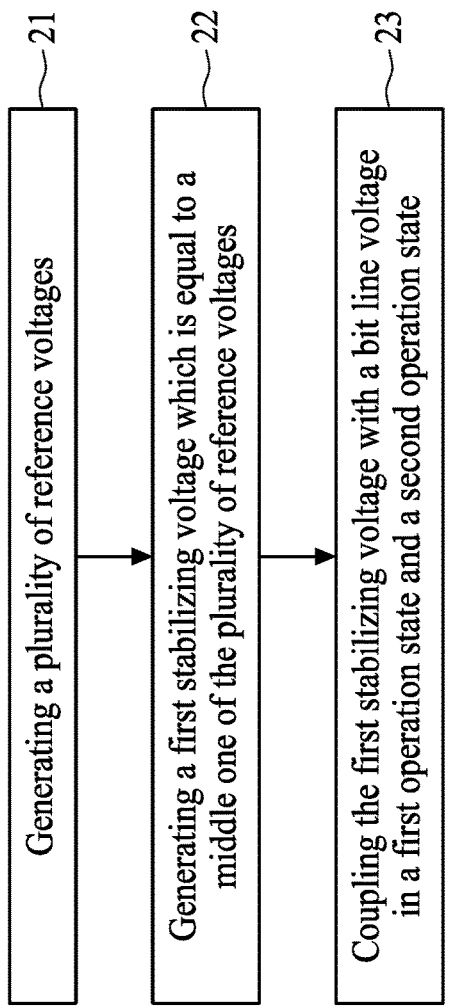
FIG. 7 is a flowchart illustrating a method for stabilizing a bit line voltage in accordance with some embodiments of the present disclosure.

FIG. 7 is a flowchart illustrating a method 2 for stabilizing a bit line voltage (VBL) in accordance with some embodiments of the present disclosure. Referring to FIG. 7, in some embodiments, the method 2 includes a step 21, in which the plurality of reference voltages are generated; a step 22, in which the first stabilizing voltage (Vs1), which is equal to the middle one of the plurality of reference voltages, is generated; a step 23, in which the second stabilizing voltage (Vs2), which is equal to one of the highest and the lowest of the plurality of reference voltages, is generated; and a step 24, in which the first stabilizing voltage (Vs1) and the second stabilizing voltage (Vs2) are coupled to the bit line voltage (VBL).

Figure 8:
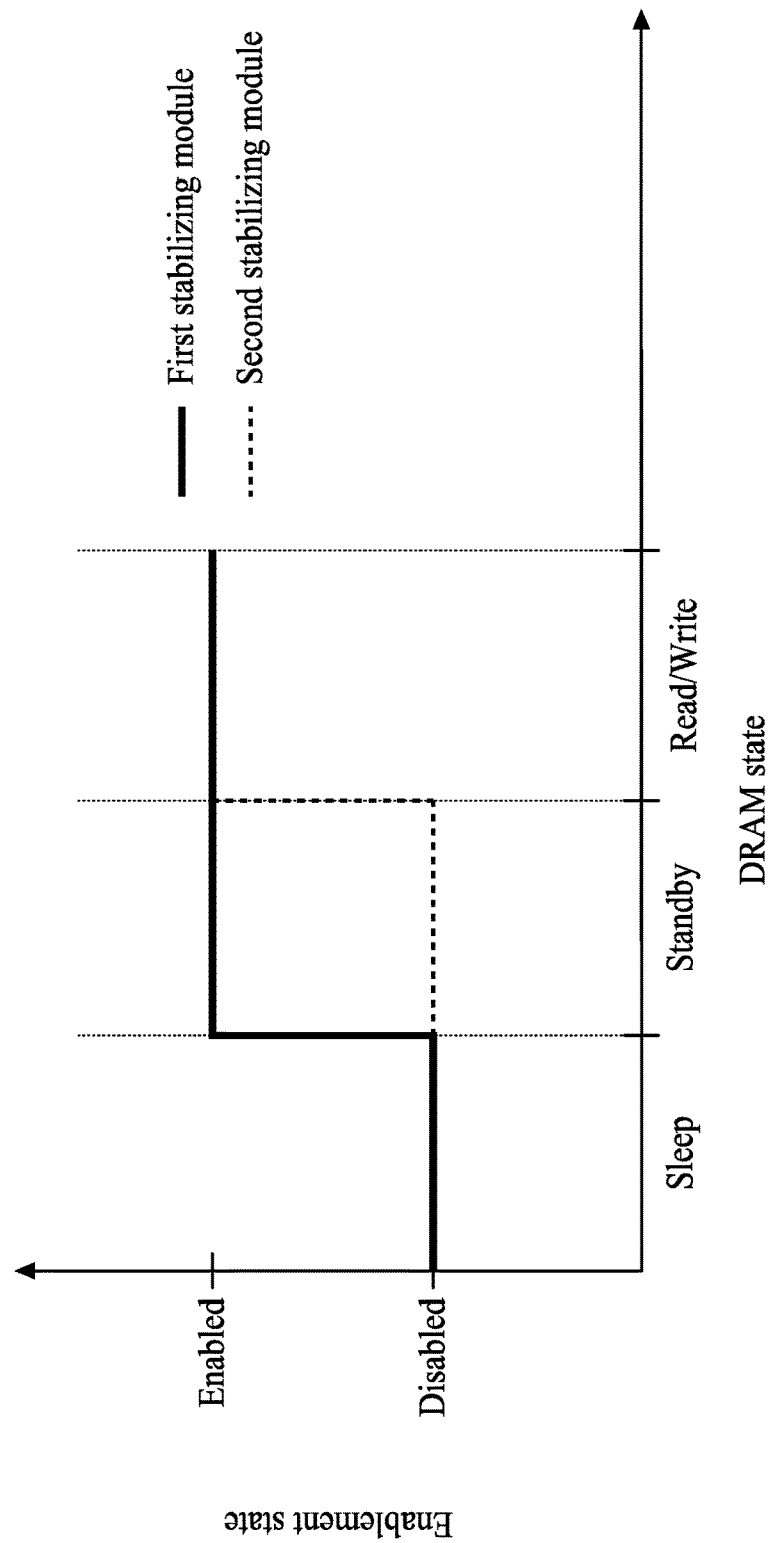
FIG. 8 is a schematic plot illustrating enablement states of the first stabilizing module and the second stabilizing module in accordance with some embodiments of the present disclosure.

FIG. 8 is a schematic plot illustrating enablement states of the first stabilizing module 12 and the second stabilizing module 14 in accordance with some embodiments of the present disclosure. Referring to FIG. 8, in some embodiments, an operation of the DRAM 9 can be divided into three states: a sleep state, where the DRAM 9 is not operated; the standby state, where elements in the DRAM 9 are precharged to preset values; and the read/write state, where the memory array 91 of the DRAM 9 (see FIG. 1) performs a data reading process or a data writing process.

Referring to FIG. 8, in some embodiments, when the DRAM 9 is in the sleep state, the first and second stabilizing modules 12 and 14 are disabled; when the DRAM 9 is in the standby state, the first stabilizing module 12 is enabled to generate the first stabilizing voltage (Vs1) for the plurality of bit lines 99 (see FIG. 1), such that the bit line voltages (VBL) of the plurality of bit lines 99 are stabilized to the second reference voltage (VR2), and the second stabilized module 14 is still disabled; and when the DRAM 9 is in the read/write state, the first stabilizing module 12 is still enabled to continue generating the first stabilizing voltage (Vs1), and the second stabilizing module 14 is enabled to generate the second stabilizing voltage (Vs2), such that the second stabilizing voltage secondarily stabilizes the bit line voltages (VBL) of the plurality of bit lines 99.

Referring to FIG. 8, in some embodiments, when the DRAM 9 is in the standby state, a voltage of each of the plurality of bit lines 99 is not reduced, and the bit line voltages (VBL) of the bit lines 99 can be stabilized to the second reference voltage (VR2) by the first stabilizing voltage (Vs1). In some embodiments, when the DRAM 9 is in the read/write state, the voltage of each of the plurality of bit lines 99 is reduced because an operation of the memory array 91 consumes current flowing in the plurality of bit lines 99, thereby leading to a voltage drop of each of the plurality of bit lines 99. In some embodiments, when the voltage drop of each of the plurality of bit lines 99 takes place, and when the bit line voltage (VBL) of each of the bit lines 99 decreases to a voltage that is less than the lowest one of the plurality of reference voltages, the second stabilizing voltage secondarily stabilizes the bit line voltages (VBL) of the plurality of bit lines 99.

Figure 9:
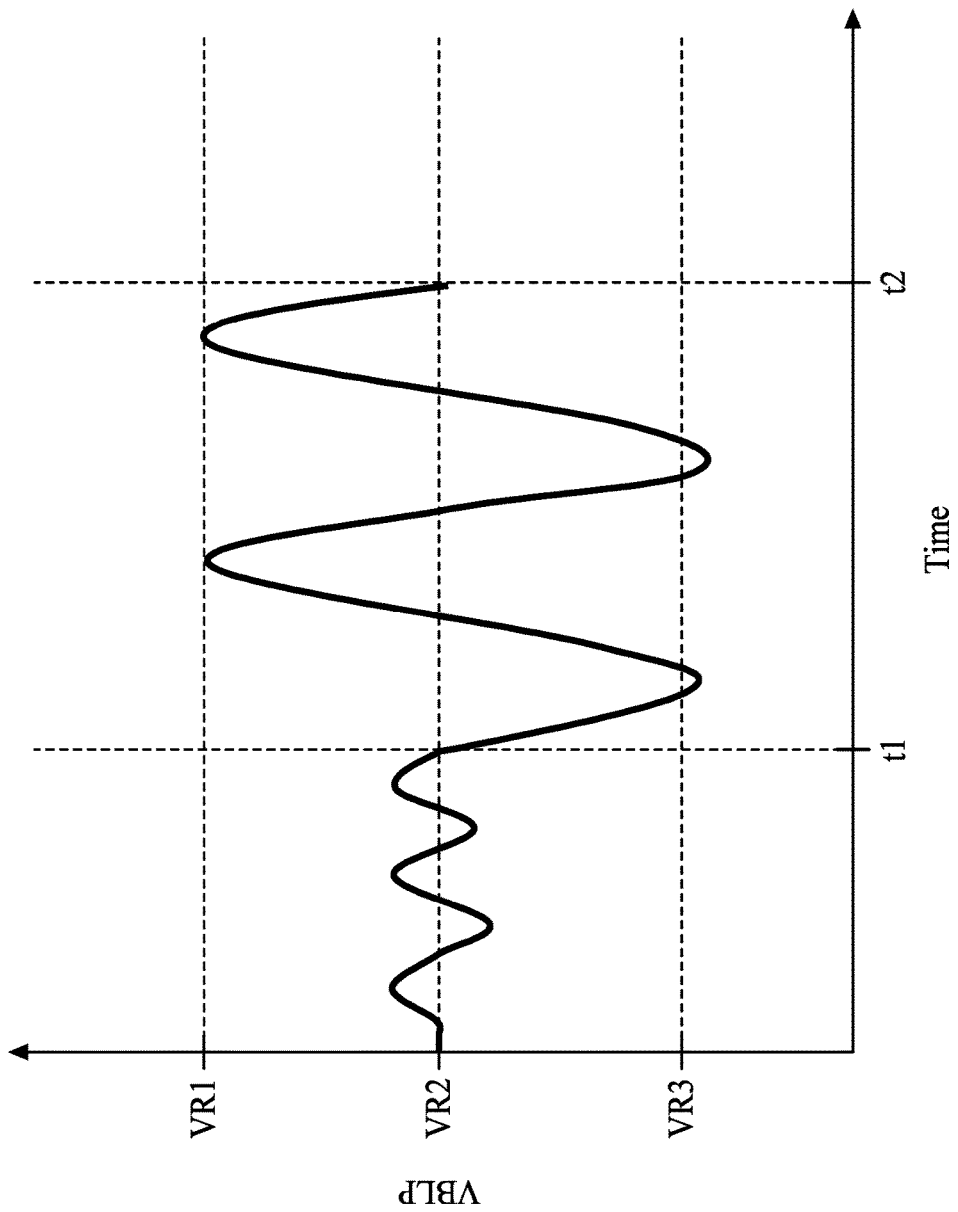
FIG. 9 is a schematic plot illustrating a voltage oscillation of the bit line in accordance with some embodiments of the present disclosure.

FIG. 9 is a schematic plot illustrating a voltage oscillation of the bit line 99 in accordance with some embodiments of the present disclosure. Referring to FIG. 9, in some embodiments, the DRAM 9 is in the standby state before a first time point (t1), and the DRAM 9 is in the read/write state between the first time point (t1) and a second time point (t2). In some embodiments, when the DRAM 9 is in the standby state, with the influence of the first stabilizing voltage (Vs1), the bit line voltage (VBL) of each of the plurality of bit lines 99 oscillates around the second reference voltage (VR2). In some embodiments, when the DRAM 9 is in the read/write state, the bit line voltage (VBL) of each of the plurality of bit lines 99 first drops to the voltage that is less than the third reference voltage (VR3) due to the voltage drop of each of the plurality of bit lines 99, and the second stabilizing voltage (Vs2) then pulls the bit line voltage (VBL) of each of the plurality of bit lines 99 to the first reference voltage (VR1). In some embodiments, when another voltage drop of each of the plurality of bit lines 99 takes place, the bit line voltage (VBL) of each of the plurality of bit lines 99 again drops to the voltage that is less than the third reference voltage (VR3), and the second stabilizing voltage (Vs2) again pulls the bit line voltage (VBL) of each of the plurality of bit lines 99 to the first reference voltage (VR1). In some embodiments, an oscillating amplitude of the bit line voltage (VBL) of each of the plurality of bit lines 99 when the DRAM 9 is in the read/write state is greater than an oscillating amplitude of the bit line voltage (VBL) of each of the plurality of bit lines 99 when the DRAM 9 is in the standby state.

Figure 10:
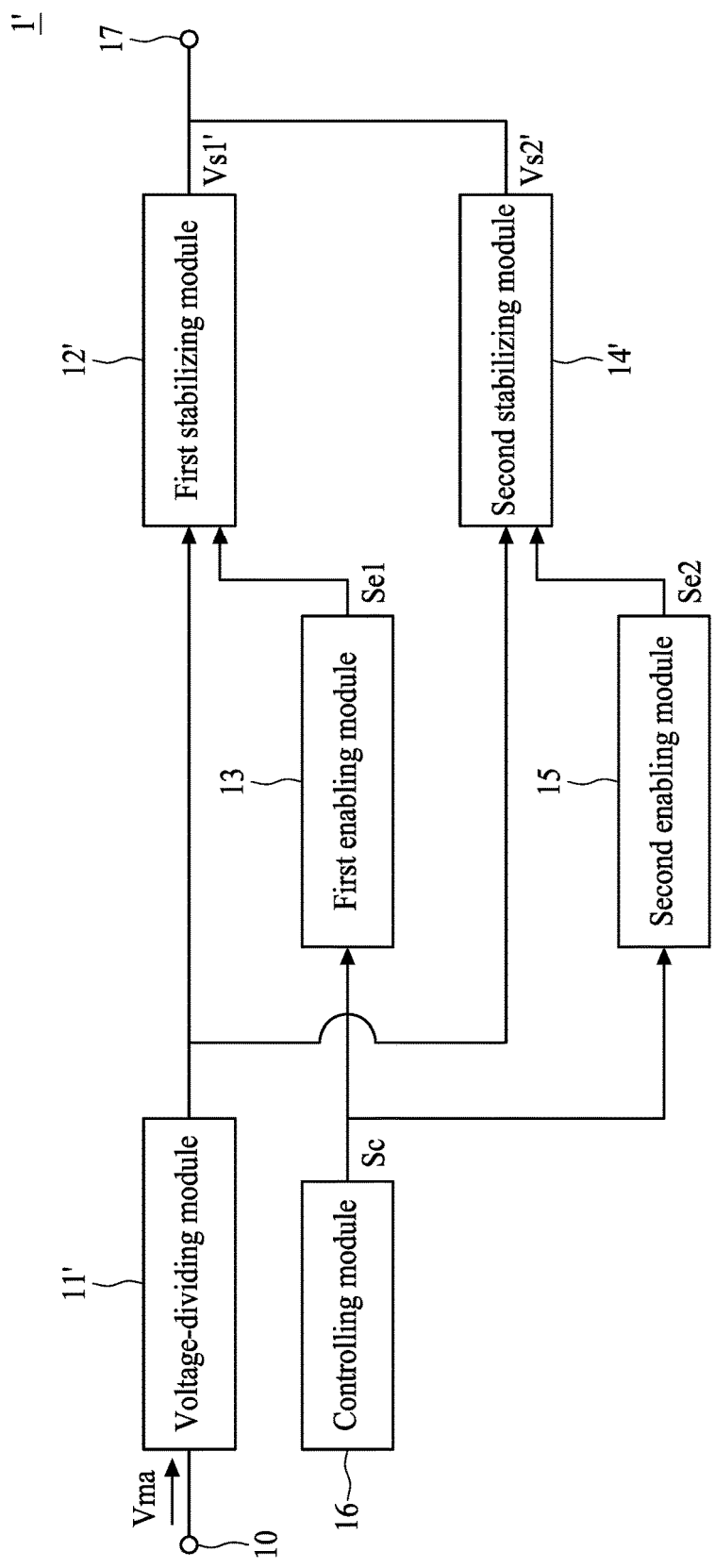
FIG. 10 is a block diagram of a comparative voltage-stabilizing circuit.

FIG. 10 is a block diagram of a comparative voltage-stabilizing circuit 1'. Referring to FIG. 10, the comparative voltage-stabilizing circuit 1' is substantially similar to the voltage-stabilizing circuit 1 of the present disclosure, except for differences in the voltage-dividing module 11', the first stabilizing module 12' and the second stabilizing module 14'. The first and second stabilizing modules 12' and 14' are coupled to the VBLP output 17. The first enabling module 13 is coupled to the first stabilizing module 12'. The second enabling module 15 is coupled to the second stabilizing module 14'. The voltage-dividing module 11' is coupled between the voltage input 10 and the first stabilizing module 12', and between the voltage input 10 and the second stabilizing module 14'.

Figure 11:
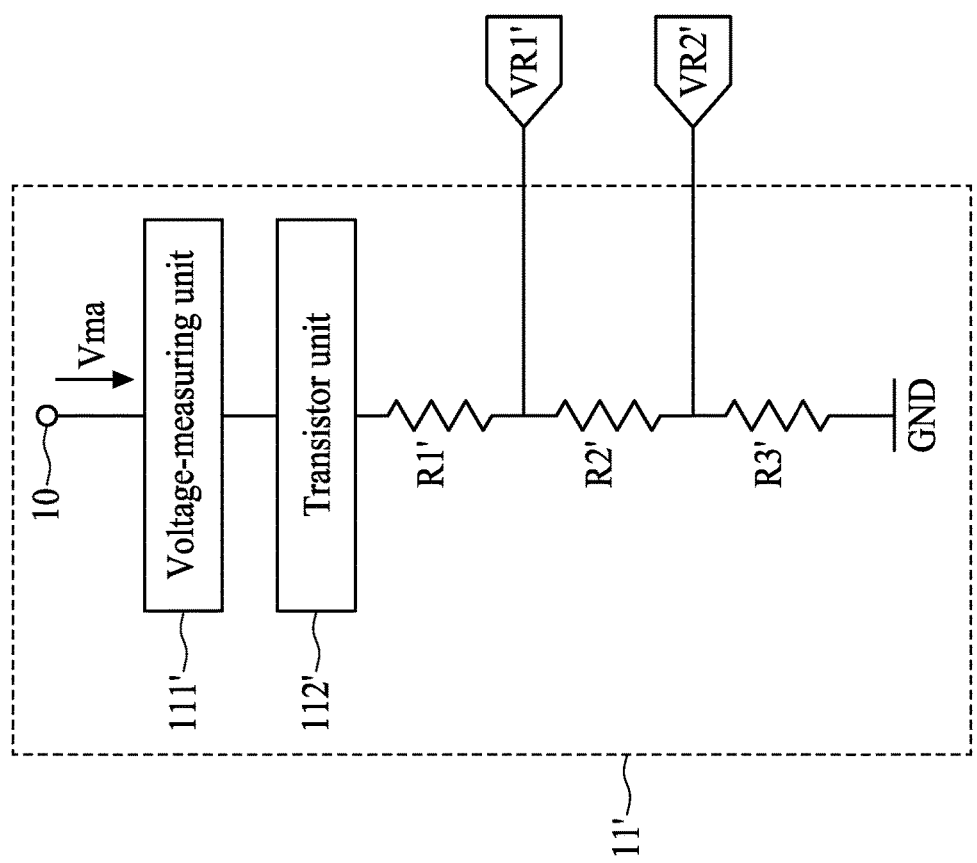
FIG. 11 is a block diagram illustrating a voltage-dividing module of the comparative voltage-stabilizing circuit.

FIG. 11 is a block diagram illustrating the voltage-dividing module 11' of the comparative voltage-stabilizing circuit 1'. Referring to FIG. 11, the voltage-driving module 11' is configured to generate two reference voltages (VR1' and VR2'), and includes a voltage-measuring unit 111', a transistor unit 112' and a plurality of resistors. Configurations of the voltage-measuring unit 111' and the transistor unit 112' are similar to configurations of the voltage-measuring unit 111 and the transistor unit 112 of the voltage-stabilizing circuit 1 of the present disclosure (see FIG. 3). The voltage-dividing module 11' includes three resistors (R1', R2' and R3'), such that the two reference voltages (VR1' and VR2') are converted from the memory array voltage (Vma) through the three resistors (R1', R2' and R3').

Figure 12:
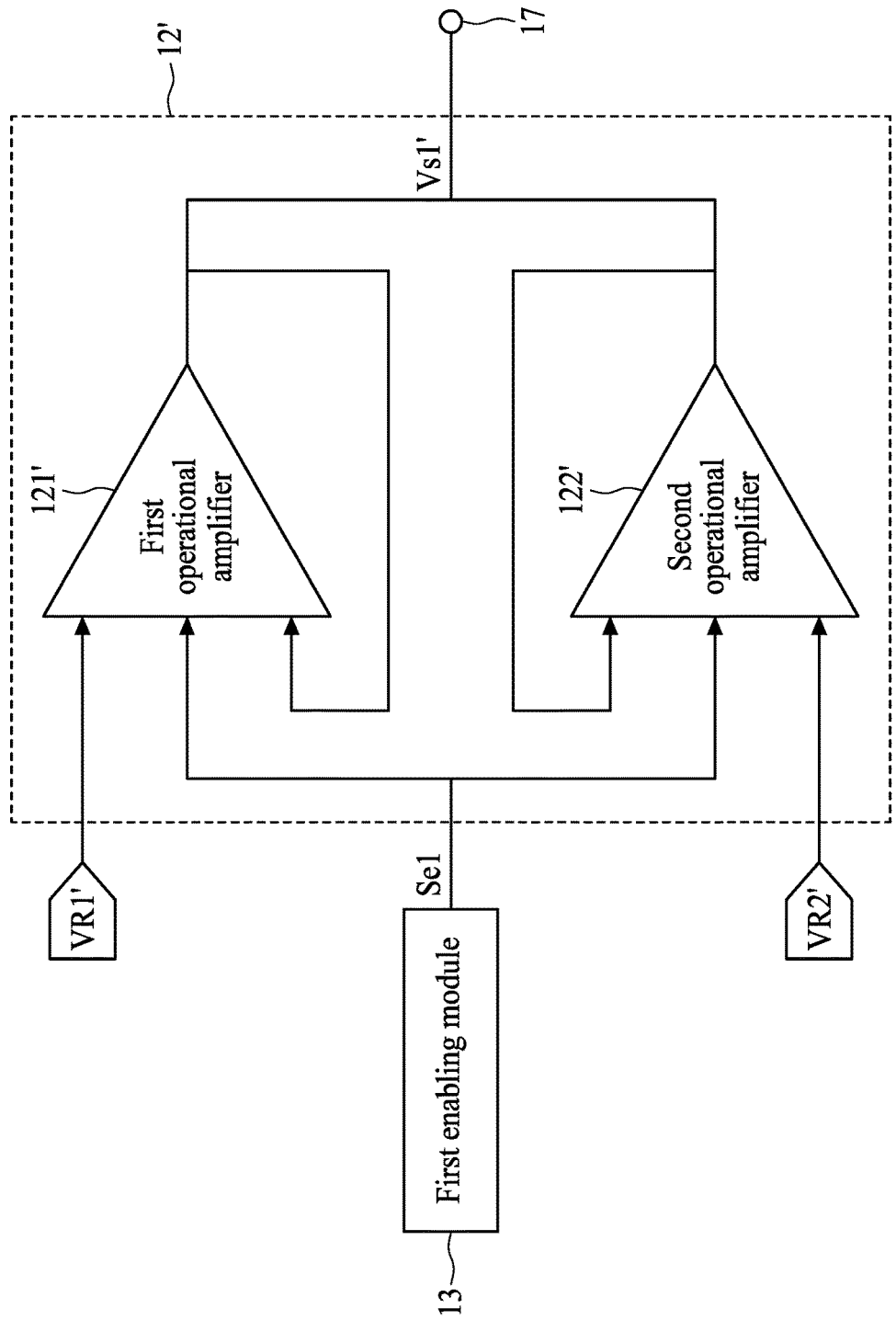
FIG. 12 is a block diagram illustrating a first stabilizing module of the comparative voltage-stabilizing circuit.

FIG. 12 is a block diagram illustrating the first stabilizing module 12' of the comparative voltage-stabilizing circuit 1'. Referring to FIG. 12, the first stabilizing module 12' includes a first operational amplifier 121' and a second operational amplifier 122', both coupled between the voltage-dividing module 11' (see FIG. 11) and the VBLP output 17. The first reference voltage (VR1') is sent to the first operational amplifier 121', and the second reference voltage (VR2') is sent to the second operational amplifier 122'. The first stabilizing module 12' is implemented by two voltage follower circuits, the first operational amplifier 121' is coupled to one of the two voltage follower circuits, and the second operational amplifier 122' is coupled to the other one of the two voltage follower circuits. The first stabilizing module 12' is configured to generate a first stabilizing voltage (Vs1'). The first stabilizing voltage (Vs1') is equal to one of the first reference voltage (VR1') and the second reference voltage (VR2'). One of the first operational amplifier 121' and the second operational amplifier 122' is configured to generate the first stabilizing voltage (Vs1') based on the first enable signal (Se1) of the first enabling module 13. The first stabilizing voltage (Vs1') is coupled to the plurality of bit lines 99 (see FIG. 1) through the VBLP output 17.

Figure 13:
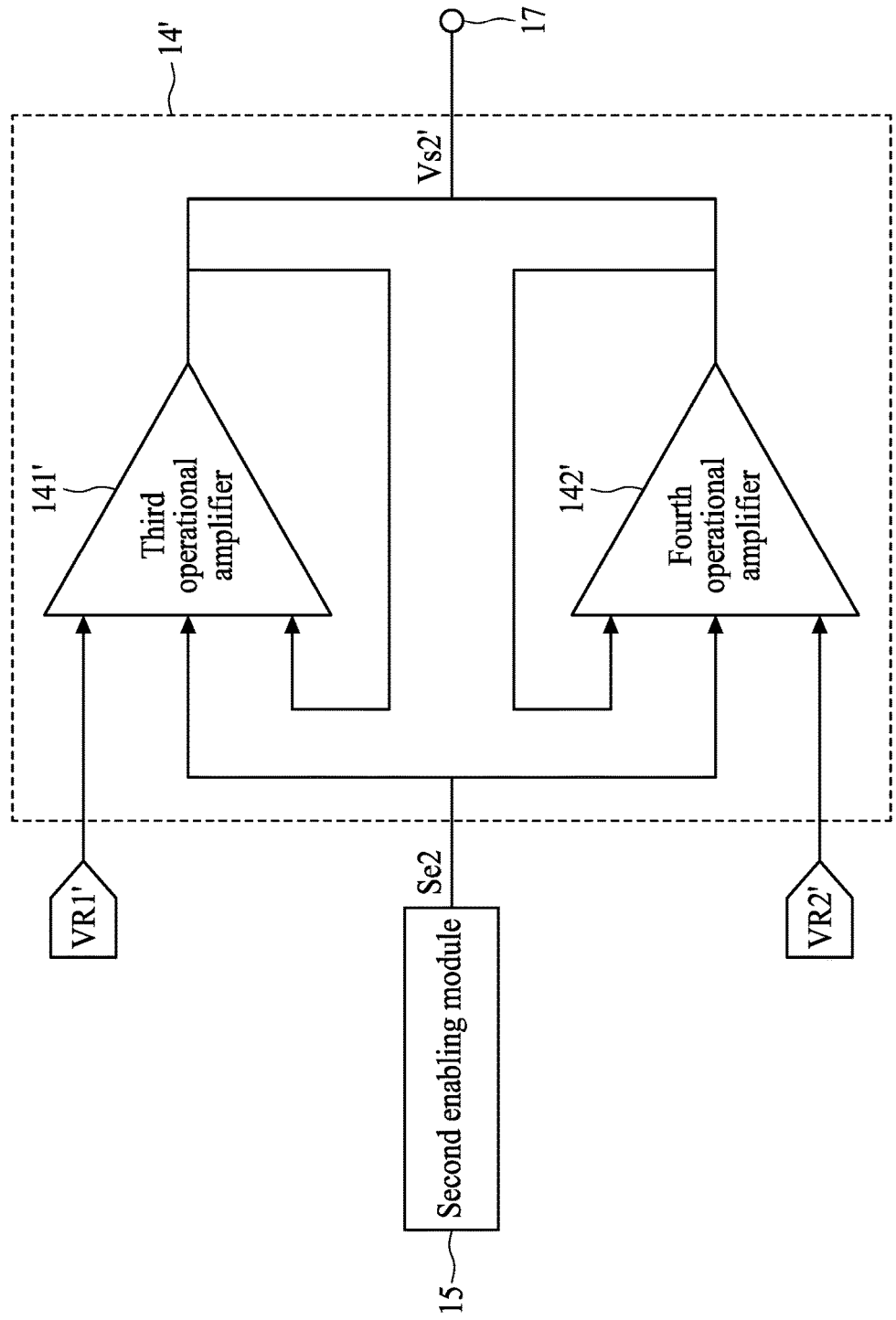
FIG. 13 is a block diagram illustrating a second stabilizing module of the comparative voltage-stabilizing circuit.

FIG. 13 is a block diagram illustrating the second stabilizing module 14' of the comparative voltage-stabilizing circuit 1'. Referring to FIG. 13, the second stabilizing module 14' includes a third operational amplifier 141' and a fourth operational amplifier 142', both coupled between the voltage-dividing module 11' (see FIG. 11) and the VBLP output 17. The first reference voltage (VR1') is sent to the third operational amplifier 141', and the second reference voltage (VR2') is sent to the fourth operational amplifier 142'. The second stabilizing module 12' is implemented by two voltage follower circuits, the third operational amplifier 141' is coupled to one of the two voltage follower circuits, and the fourth operational amplifier 142' is coupled to the other one of the two voltage follower circuits. The second stabilizing module 14' is configured to generate a second stabilizing voltage (Vs2'). The second stabilizing voltage (Vs2') is equal to one of the first reference voltage (VR1') and the second reference voltage (VR2'). One of the third operational amplifier 141' and the fourth operational amplifier 142' is configured to generate the second stabilizing voltage (Vs2') based on the second enable signal (Se2) of the second enabling module 15. The second stabilizing voltage (Vs2') is coupled to the plurality of bit lines 99 (see FIG. 1) through the VBLP output 17.

The structures of the first stabilizing module 12' and the second stabilizing module 14' are substantially similar to each other, with the main difference between the first stabilizing module 12' and the second stabilizing module 14' being in fundamental parameters of a plurality of transistors included in the first stabilizing module 12' and the second stabilizing module 14'. For example, a gate length, a gate width and a resistance of each of the plurality of transistors included in the first stabilizing module 12' are different from those of each of the plurality of transistors included in the second stabilizing module 14'.

During a voltage-stabilizing process of the comparative voltage-stabilizing circuit 1', when the DRAM 9 is in the standby state, the bit line voltages (VBL) of the plurality of bit lines 99 may be greater than the first reference voltage (VR1') or less than the second reference voltage (VR2'), and the first stabilizing voltage (Vs1') pulls up or pulls down the bit line voltages (VBL) of the plurality of bit lines 99 to stabilize the bit line voltages (VBL) of the plurality of bit lines 99 between the first reference voltage (VR1') and the second reference voltage (VR2'). When the DRAM 9 is in the read/write state, and when the voltage drop of each of the plurality of bit lines 99 takes place and the bit line voltage (VBL) of each of the plurality of bit lines 99 decreases to a voltage that is less than the second reference voltage (VR2'), the second stabilizing voltage (Vs2') secondarily stabilizes the bit line voltages (VBL) of the plurality of bit lines 99 between the first reference voltage (VR1') and the second reference voltage (VR2').

Figure 14:
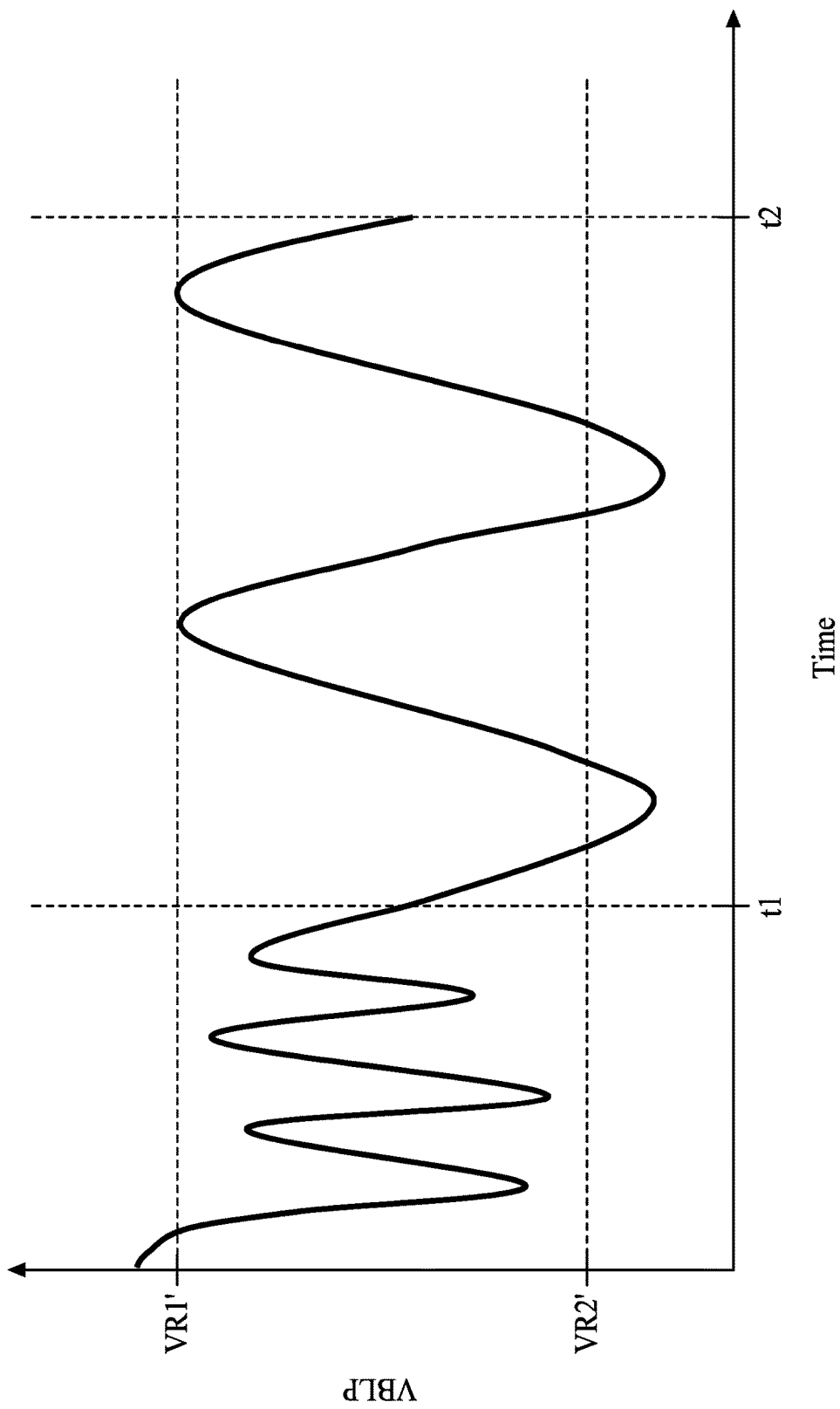
FIG. 14 is a schematic plot illustrating a voltage oscillation of the bit line when the DRAM includes the comparative voltage-stabilizing circuit.

FIG. 14 is a schematic plot illustrating a voltage oscillation of the bit line 99 when the DRAM includes the comparative voltage-stabilizing circuit 1'. Referring to FIG. 14, when the DRAM 9 is in the standby state, with the influence of the first stabilizing voltage (Vs1'), the bit line voltage (VBL) of each of the plurality of bit lines 99 oscillates between the first reference voltage (VR1') and the second reference voltage (VR2'). When the DRAM 9 is in the read/write state, the bit line voltage (VBL) of each of the plurality of bit lines 99 first drops to the voltage that is less than the second reference voltage (VR2') due to the voltage drop of each of the plurality of bit lines 99, and the second stabilizing voltage (Vs2') then pulls the bit line voltage (VBL) of each of the plurality of bit lines 99 to the first reference voltage (VR1'). When another voltage drop of each of the plurality of bit lines 99 takes place, the bit line voltage (VBL) of each of the plurality of bit lines 99 again drops to the voltage that is less than the third reference voltage (VR2'), and the second stabilizing voltage (Vs2') again pulls the bit line voltage (VBL) of each of the plurality of bit lines 99 to the first reference voltage (VR1').

In the comparative voltage-stabilizing circuit 1', during the voltage-stabilizing process, when the DRAM 9 is in the standby state, the bit line voltages (VBL) of the plurality of bit lines 99 oscillate between the first reference voltage (VR1') and the second reference voltage (VR2'). In such a configuration, when the DRAM 9 changes from the standby state to the read/write state and the voltage drop of each of the plurality of bit lines 99 takes place, a lot of working current and a lot of time are required to stabilize the bit line voltages (VBL) of the plurality of bit lines 99. In contrast, during the voltage-stabilizing process of the voltage-stabilizing circuit 1 of the present disclosure, when the DRAM 9 is in the standby state, because the bit line voltages (VBL) of the plurality of bit lines 99 oscillate around the second reference voltage (VR2), the oscillating amplitude of the bit line voltage (VBL) of each of the plurality of bit lines 99 is small. In addition, when the DRAM 9 changes from the standby state to the read/write state and the voltage drop of each of the plurality of bit lines 99 takes place, less working current and less time are required to stabilize the bit line voltages (VBL) of the plurality of bit lines 99. Therefore, the voltage-stabilizing process of the voltage-stabilizing circuit 1 of the present disclosure has both greater stabilizing accuracy and better efficiency than comparative configurations.

One aspect of the present disclosure provides a voltage-stabilizing circuit. The voltage-stabilizing circuit comprises a voltage-dividing module, a first stabilizing module and a second stabilizing module. The voltage-dividing module is configured to generate a plurality of reference voltages. The first stabilizing module is coupled to the voltage-dividing module and is configured to generate a first stabilizing voltage, wherein the first stabilizing voltage is equal to a middle one of the plurality of reference voltages. The second stabilizing module is coupled to the voltage-dividing module and is configured to generate a second stabilizing voltage, wherein the second stabilizing voltage is equal to one of the plurality of reference voltages other than the middle one.

One aspect of the present disclosure provides a dynamic random access memory (DRAM). The DRAM comprises a memory array, a plurality of bit lines and a voltage-stabilizing module. The plurality of bit lines are existed in the memory array. The voltage-stabilizing module is coupled to the plurality of bit lines. In some embodiments, the voltage stabilizing module includes a voltage-dividing module, a first stabilizing module and a second stabilizing module. The voltage-dividing module is configured to generate a plurality of reference voltages. The first stabilizing module is coupled to the voltage-dividing module and is configured to generate a first stabilizing voltage, wherein the first stabilizing voltage is equal to a middle one of the plurality of reference voltages. The second stabilizing module is coupled to the voltage-dividing module and is configured to generate a second stabilizing voltage, wherein the second stabilizing voltage is equal to one of the plurality of reference voltages other than the middle one.

One aspect of the present disclosure provides a method for stabilizing a bit line voltage. The method comprises the following steps. A plurality of reference voltages are generated. A first stabilizing voltage, which is equal to a middle one of the plurality of reference voltages, is generated. The first stabilizing voltage is coupled with a bit line voltage in a first operation state and a second operation state.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A voltage-stabilizing circuit, comprising:
   a voltage-dividing module configured to generate a plurality of reference voltages;
   a first stabilizing module coupled to the voltage-dividing module and configured to generate a first stabilizing voltage, wherein the first stabilizing voltage is equal to a middle one of the plurality of reference voltages;
   a second stabilizing module coupled to the voltage-dividing module and configured to generate a second stabilizing voltage, wherein the second stabilizing voltage is equal to one of the plurality of reference voltages other than the middle one;
   a first enabling module coupled to the first stabilizing module and configured to generate a first enable signal; and
   a second enabling module coupled to the second stabilizing module and configured to generate a second enable signal.

2. The voltage-stabilizing circuit of claim 1, further comprising a controlling module coupled to the first enabling module and the second enabling module, wherein the controlling module is configured to send control signals to the first enabling module and the second enabling module.

3. The voltage-stabilizing circuit of claim 2, wherein the controlling module sends the control signals to the first enabling module and the second enabling module under different conditions.

4. The voltage-stabilizing circuit of claim 1, wherein:
   the voltage-dividing module is further configured to convert a memory array voltage into the plurality of reference voltages; and
   the voltage-dividing module includes a plurality of resistors, and a transistor unit coupled to the plurality of resistors and configured to complementarily adjust resistances of the plurality of resistors.

5. The voltage-stabilizing circuit of claim 1, wherein the first stabilizing module includes an operational amplifier coupled to the voltage-dividing module, and the operational amplifier is configured to generate the first stabilizing voltage.

6. The voltage-stabilizing circuit of claim 1, wherein:
   the second stabilizing module includes two operational amplifiers, both coupled to the voltage-dividing module; and
   one of the two operational amplifiers is configured to generate the second stabilizing voltage.

7. A dynamic random access memory (DRAM), comprising:
   a memory array;
   a plurality of bit lines existed in the memory array; and
   a voltage-stabilizing module coupled to the plurality of bit lines;
   wherein the voltage stabilizing module includes:
   a voltage-dividing module configured to generate a plurality of reference voltages,
   a first stabilizing module coupled to the voltage-dividing module and configured to generate a first stabilizing voltage, wherein the first stabilizing voltage is equal to a middle one of the plurality of reference voltages,
   a second stabilizing module coupled to the voltage-dividing module and configured to generate a second stabilizing voltage, wherein the second stabilizing voltage is equal to one of the plurality of reference voltages other than the middle one;

a first enabling module coupled to the first stabilizing module and configured to generate a first enable signal; and a second enabling module coupled to the second stabilizing module and configured to generate a second enable signal.

8. The DRAM of claim 7, further comprising a controlling module coupled to the first enabling module and the second enabling module, wherein the controlling module is configured to send control signals to the first enabling module and the second enabling module.

9. The DRAM of claim 8, wherein the controlling module sends the control signals to the first enabling module and the second enabling module under different conditions.

10. The DRAM of claim 7, wherein:
the voltage-dividing module is further configured to convert a memory array voltage into the plurality of reference voltages; and
the voltage-dividing module includes a plurality of resistors, and a transistor unit coupled to the plurality of resistors and configured to complementarily adjust resistances of the plurality of resistors.

11. The DRAM of claim 7, wherein the first stabilizing module includes an operational amplifier coupled to the voltage-dividing module, and the operational amplifier is configured to generate the first stabilizing voltage.

12. The DRAM of claim 7, wherein:
the second stabilizing module includes two operational amplifiers, both coupled to the voltage-dividing module; and
one of the two operational amplifiers is configured to generate the second stabilizing voltage.

13. A method, comprising:
generating a plurality of reference voltages;
generating a first stabilizing voltage based on the plurality of the reference voltages, which is equal to a middle one of the plurality of reference voltages; and
coupling the first stabilizing voltage with a bit line voltage in a first operation state and a second operation state.

14. The method of claim 13 wherein the plurality of reference voltages are generated by dividing a memory array voltage.

15. The method of claim 13, further comprising enabling a first stabilizing module to generate the first stabilizing voltage.

16. The method of claim 15, further comprising:
generating a second stabilizing voltage, which is equal to one of the plurality of reference voltages other than the middle one; and
coupling the second stabilizing voltage with the bit line voltage in the second operation state.

17. The method of claim 16, further comprising enabling a second stabilizing module to generate the second stabilizing voltage.

18. The method of claim 17, further comprising generating control signals for a first enabling module and a second enabling module under different conditions.

* * * * *